United States Patent
Kwon

(10) Patent No.: US 9,171,861 B2
(45) Date of Patent: Oct. 27, 2015

(54) SEMICONDUCTOR MEMORY DEVICE AND SYSTEM HAVING THE SAME

(71) Applicant: SK hynix Inc., Icheon-si Gyeonggi-do (KR)

(72) Inventor: Il Young Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 221 days.

(21) Appl. No.: 13/958,201

(22) Filed: Aug. 2, 2013

(65) Prior Publication Data

US 2014/0334230 A1    Nov. 13, 2014

(30) Foreign Application Priority Data

May 7, 2013    (KR) .......................... 10-2013-0051173

(51) Int. Cl.
*G11C 11/34* (2006.01)
*H01L 27/115* (2006.01)
*G11C 16/04* (2006.01)
*H01L 29/792* (2006.01)

(52) U.S. Cl.
CPC ...... *H01L 27/11582* (2013.01); *G11C 16/0483* (2013.01); *H01L 29/7926* (2013.01)

(58) Field of Classification Search
CPC .................... H01L 27/11582; H01L 29/7926; G11C 16/0483
USPC .......................... 365/185.11, 185.05; 257/317
See application file for complete search history.

(56) References Cited

U.S. PATENT DOCUMENTS

2004/0113199 A1*  6/2004  Hazama et al. ................ 257/317
2010/0207195 A1*  8/2010  Fukuzumi et al. ............. 257/326

FOREIGN PATENT DOCUMENTS

KR    1020120088360 A    8/2012

* cited by examiner

*Primary Examiner* — Richard Elms
*Assistant Examiner* — Mohammed A Bashar
(74) *Attorney, Agent, or Firm* — William Park & Associates Ltd.

(57) ABSTRACT

A semiconductor memory device includes a first dummy transistor coupled to a bit line, a first select transistor formed where a first selection line surrounds a vertical channel layer, a second dummy transistor coupled to a common source line, a second select transistor formed where a second selection line surrounds the vertical channel layer, and main cell transistors coupled between the first and second select transistors.

17 Claims, 13 Drawing Sheets

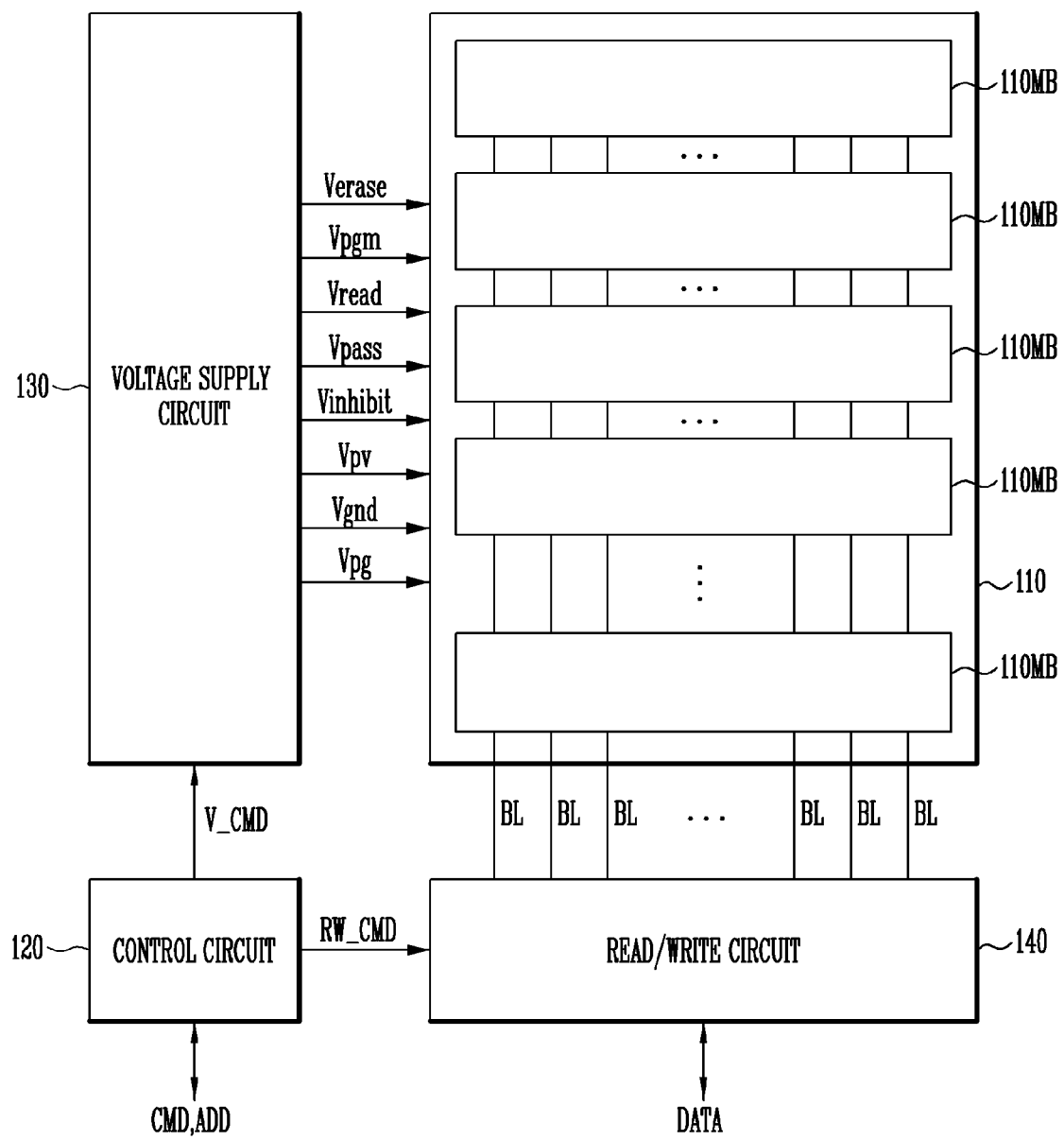

SEMICONDUCTOR MEMORY DEVICE AND SYSTEM HAVING THE SAME

CROSS-REFERENCE TO RELATED APPLICATION

The present application claims priority under 35 U.S.C. §119(a) to Korean patent application number 10-2013-0051173 filed on May 7, 2013, in the Korean Intellectual Property Office, the entire disclosure of which is incorporated herein by reference in its entirety.

BACKGROUND

1. Technical Field

Various embodiments of the present invention relate generally to a semiconductor memory device, and more particularly to a semiconductor memory device including a dummy cell and a method of operating the same.

2. Related Art

A semiconductor memory device may include dummy cells each coupled between a bit line and a memory cell or between a common source line and the memory cell in order to improve electrical characteristics of the memory cell coupled to the bit line or the common source line.

In general, a dummy cell functions as a switch device. In order to function as the switch device, a threshold voltage of the dummy cell is set to a predetermined level. When the dummy cell and the main cell have the same structure, a threshold voltage distribution of dummy cells, coupled to bit lines or a common source line, is to be narrowed to improve electrical characteristics of the semiconductor memory device are to be improved.

SUMMARY

Various embodiments of the present invention relate to a semiconductor memory device improving electrical characteristics and a method of operating the same.

A semiconductor memory device according to an embodiment of the present invention may include a first dummy transistor coupled to a bit line, a first select transistor coupled to the first dummy transistor, a second dummy transistor coupled to a common source line, a second select transistor coupled to the second dummy transistor, and main cell transistors coupled between the first and second select transistors.

A semiconductor memory device according to an embodiment of the present invention may include a plurality of memory strings coupled between a plurality of bit lines and a common source line, wherein each of the plurality of memory strings includes a first dummy transistor coupled to the bit line, a first select transistor, main cell transistors, a second select transistor and a second dummy transistor coupled to the common source line, and a peripheral circuit configured to perform a program operation of the first and second select transistors and the main cell transistors and a read operation and an erase operation of the main cell transistors, wherein the peripheral circuit is configured to turn on the first dummy transistor and turn off the second dummy transistor during the program operation.

An embodiment of the present invention includes a semiconductor memory device comprising: a first dummy transistor formed where a first dummy gate line surrounds a vertical channel layer and coupled to a first select transistor; a second dummy transistor formed where a second dummy gate line surrounds the vertical channel and coupled to a second select transistor; and main cell transistors coupled between the first and second select transistors.

In an embodiment of the present invention, a memory system includes a memory controller and a semiconductor memory device. The semiconductor memory device includes a first dummy transistor coupled to a bit line; a first select transistor formed at a position where a first selection line surrounds a vertical channel layer; a second dummy transistor coupled to a common source line; a second select transistor formed at a position where a second selection line surrounds the vertical channel layer; and main cell transistors coupled between the first and second select transistors.

In an embodiment of the present invention, an electronic device includes a memory system communicatively coupled to a central processing unit. The memory includes a semiconductor memory device. The semiconductor memory device includes a first dummy transistor coupled to a bit line; a first select transistor formed at a position where a first selection line surrounds a vertical channel layer; a second dummy transistor coupled to a common source line; a second select transistor formed at a position where a second selection line surrounds the vertical channel layer; and main cell transistors coupled between the first and second select transistors.

BRIEF DESCRIPTION OF THE DRAWINGS

FIG. 1 is a block diagram of a semiconductor memory device according to an embodiment of the present invention;

DETAILED DESCRIPTION

Hereinafter, various embodiments of the present invention will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

FIG. 1 is a block diagram of a semiconductor memory device according to an embodiment of the present invention.

Referring to FIG. 1, a semiconductor memory device may include a memory array 110 and peripheral circuits 120 to 140. The memory array 110 may include a plurality of memory blocks 110MB. Each of the memory blocks 110B may include a plurality of memory cells. For example, when the semiconductor memory is a flash memory device, each of the memory blocks may include flash memory cells. In this example, each memory block may include flash memory cells, and each of the flash memory cells may have a floating gate including polysilicon or a charge storage layer including a nitride layer.

For example, each of the memory blocks may include memory strings each coupled to each bit line and coupled to a common source line. Each of the memory strings may have a two-dimensional (2D) or three-dimensional (3D) structure and be formed on a semiconductor substrate. A memory block including a 3D-structured memory string is described in detail below.

Figure 2A:
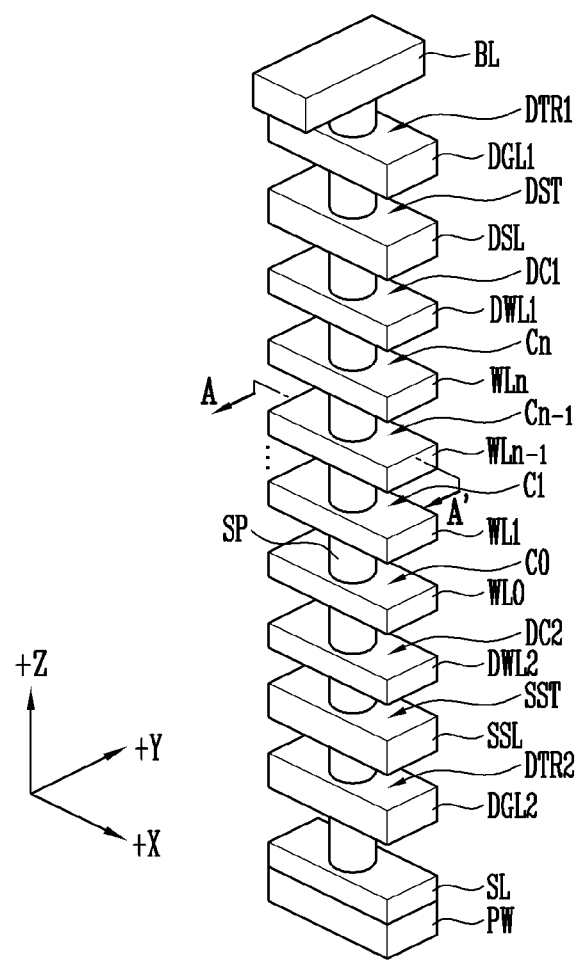
FIGS. 2A and 2B are views of a memory string included in a memory block of FIG. 1.
Figure 2B:
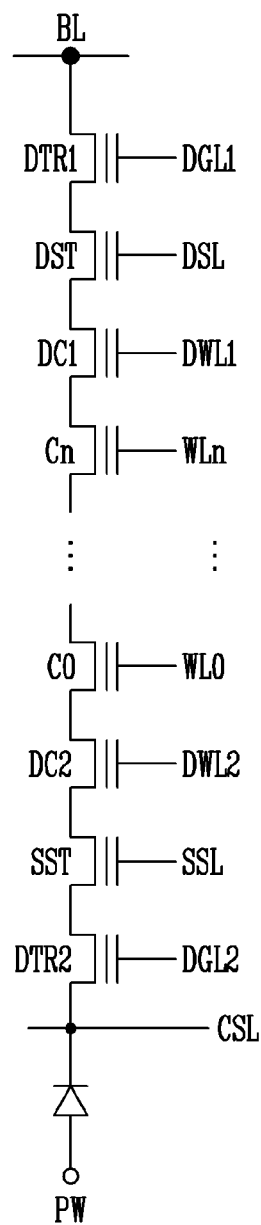

FIGS. 2A and 2B are views illustrating one of the memory strings included in each of the memory blocks of FIG. 1.

Referring to FIGS. 2A and 2B, a common source line CSL may be formed on a semiconductor substrate in which a P well PW is formed. A vertical channel layer SP may be formed on the common source line CSL. A bit line BL may be coupled to a top surface of the vertical channel layer SP. The vertical channel layer SP may include polysilicon. A plurality of conductive layers DGL1, DSL, DWL1, WL0 to WLn, DWL2, SSL and DGL2 may be formed to be coupled to the vertical channel layer SP at different heights. In an embodiment of the present invention, a plurality of conductive layers DGL1, DSL, DWL1, WL0 to WLn, DWL2, SSL and DGL2 may surround the vertical channel layer SP at different heights. A multilayer (not illustrated) including a charge storage layer may be formed on a surface of the vertical channel layer SP. The multilayer may also be located between the vertical channel layer SP and the conductive layers DGL1, DSL, DWL1, WL0 to WLn, DWL2, SSL and DGL2.

Among the plurality of conductive layers, the uppermost conductive layer may be a first dummy gate line DGL1, and the lowermost conductive layer may be a second dummy gate line DGL2. The conductive layers between dummy gate lines DGL1 and DGL2 may be a first selection line (e.g., drain selection line) DSL, word lines WL0 to WLn and a second selection line (e.g., source selection line) SSL. The conductive layer between the first selection line DSL and the uppermost word line WLn may be a first dummy word line DWL1, and the conductive layer between the second selection line SSL and the lowermost word line WL0 may be a second dummy word line DWL2.

In other words, each of the conductive layers DGL1, DSL, DWL1, WL0 to WLn, DWL2, SSL and DGL2 that surround the vertical channel layer SP on the semiconductor substrate at different heights may have a multilayered structure. The vertical channel layer SP, passing through the conductive layers DGL1, DSL, DWL1, WL0 to WLn, DWL2, SSL and DGL2, may be vertically coupled between the bit line BL and the common source line CSL formed on the semiconductor substrate.

A first dummy transistor DTR1 may be formed at a position where the first dummy gate line DGL1 surrounds the vertical channel layer SP. A first select transistor (e.g., drain select transistor) DST may be formed at a position where the first selection line DSL surrounds the vertical channel layer SP. A first dummy cell transistor (e.g., first dummy memory cell) DC1 may be formed at a position where a first dummy word line DWL1 surrounds the vertical channel layer SP. Main cell transistors (e.g., main memory cells) Cn to Co may be formed at positions where the word lines WLn to WL0 surround the vertical channel layer SP. A second dummy cell transistor (e.g., second dummy memory cell) DC2 may be formed at a position where the second dummy word line DWL2 surrounds the vertical channel layer SP. A second select transistor (e.g., source select transistor) SST may be formed at a position where the second selection line SSL surrounds the vertical channel layer SP. A second dummy transistor DTR2 may be formed at a position where the second dummy gate line DGL2 surrounds the vertical channel layer SP.

In a general 3D-structured memory string, the first select transistor DST is directly connected to the bit line BL and the second select transistor SST is directly connected to the common source line CSL. However, in the above 3D-structured memory string, the first dummy transistor DTR1 may be coupled between the first select transistor DST and the bit line BL, and the second dummy transistor DTR2 may be coupled between the second select transistor SST and the common source line CSL. In other words, in an embodiment of the present invention, dummy transistors such as the first and second dummy transistors DTR1 and DTR2, rather than the first and second select transistors DST and SST, may be directly connected to the bit line BL or the common source line CSL. As a result, the 3D-structured memory string may include the first dummy transistor DTR1, the first select transistor DST, the first dummy cell transistor DC1, , the main cell transistors Cn to C0, the second dummy cell transistor DC2, the second select transistor SST and the second dummy transistor DTR2 that are vertically coupled to the semiconductor substrate between the bit line BL and the common source line CSL.

Another type of 3D-structured memory string is described below.

Figure 3A:
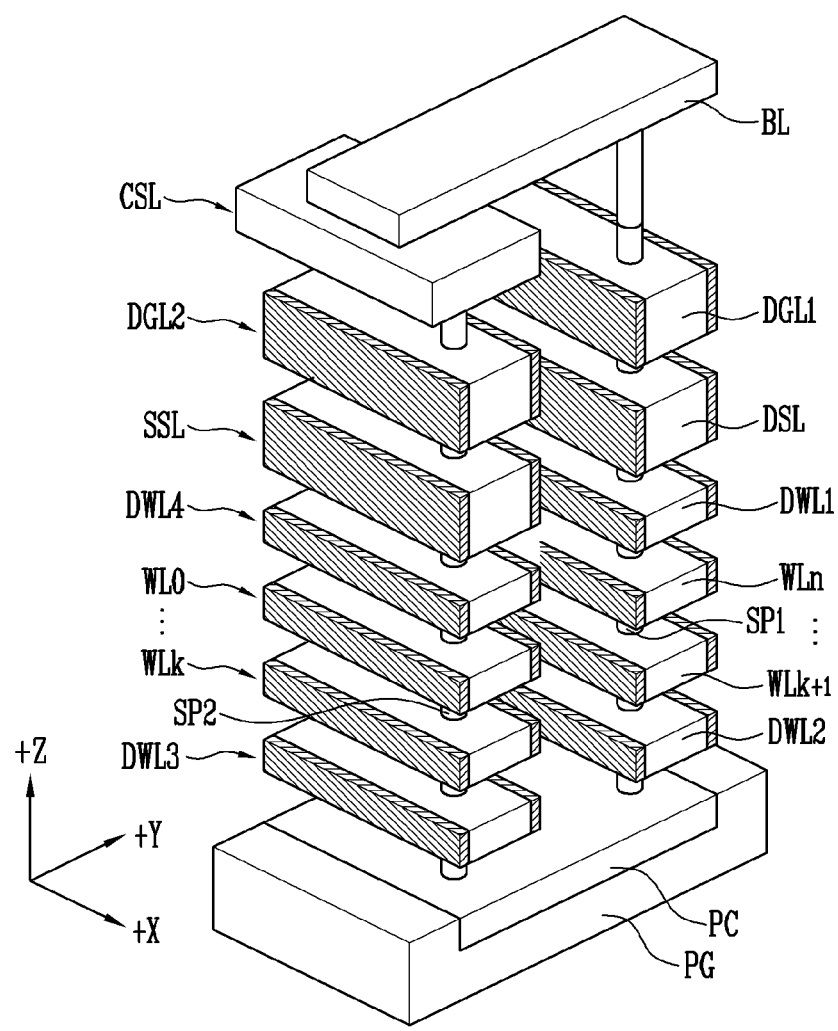
FIGS. 3A and 3B are views of another type of the memory string included in the memory block of FIG. 1.
Figure 3B:
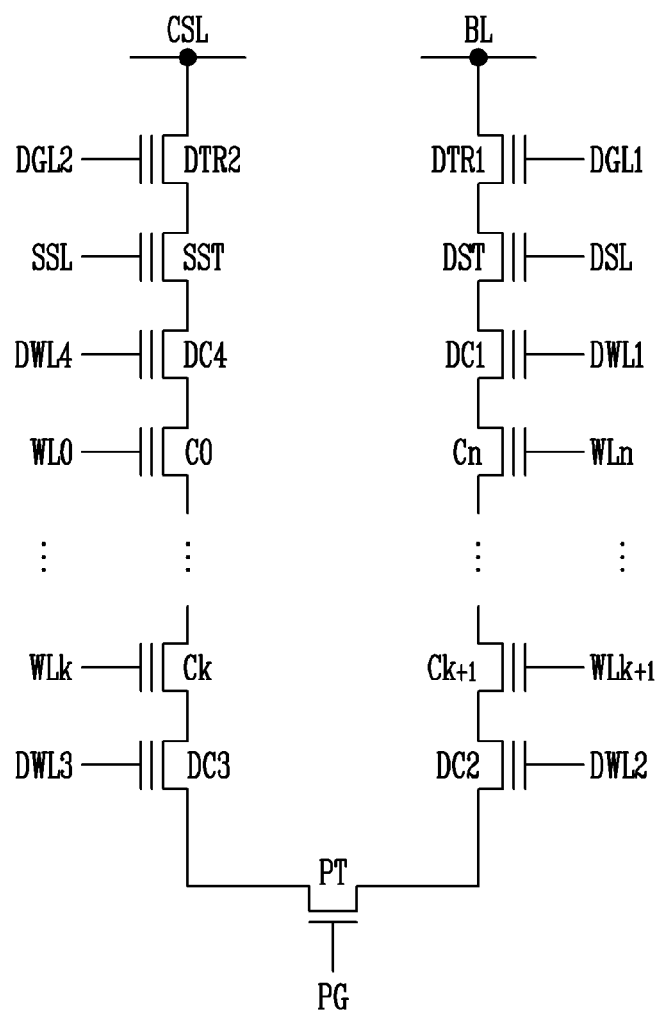

FIGS. 3A and 3B are views of another type of memory string included in the memory block of FIG. 1.

Referring to FIGS. 3A and 3B, a pipe gate PG including a recessed portion may be formed on a semiconductor substrate (not illustrated), and a pipe channel layer PC may be formed in the recessed portion of the pipe gate PG. A plurality of vertical channel layers SP1 and SP2 may be formed on the pipe channel layer PC. One end of the second vertical channel layer SP2 may be coupled to the common source line CSL and the other end of the second vertical channel layer SP2 may be coupled to the pipe channel layer PC. Further, one end of the first vertical channel layer SP1 may be coupled to the bit line BL and the other end of the first vertical channel layer SP1 may be coupled to the pipe channel layer PC. Each of the vertical channel layers SP1 and SP2 may include polysilicon.

The plurality of conductive layers DGL1, DSL, DWL1, WLn to WLk+1 and DWL2 may be formed to be coupled to the first vertical channel layer SP1 at different heights. In addition, the plurality of conductive layers DGL2, SSL, DWL4, WL0 to WLk and DWL3 may be formed to be coupled to the second vertical channel layer SP2 at different heights. In an embodiment of the present invention, the plurality of conductive layers DGL1, DSL, DWL1, WLn to WLk+1 and DWL2 may surround the first vertical channel layer SP1 at different heights. In addition, the plurality of conductive layers DGL2, SSL, DWL4, WL0 to WLk and DWL3 may surround the second vertical channel layer SP2 at different heights. A multilayer (not illustrated) including a charge storage layer may be formed on surfaces of the first and second vertical channel layers SP1 and SP2 and a surface of the pipe channel layer PC. The multilayer may also be located between the vertical channel layers SP1 and SP2 and the conductive layers DGL1, DSL, DWL1, WLn to WLk+1, DWL2, DGL2, SSL, DWL4, WL0 to WLk and DWL3 and between the pipe channel layer PC and the pipe gate PG.

Among the plurality of conductive layers, the uppermost conductive layer surrounding the first vertical channel layer SP1 may be the first dummy gate line DGL1, the conductive layer that underlies the first dummy gate line DGL1 may be the drain selection lines DSL, the conductive layer that underlies the drain selection lines DSL may be the first dummy word line DWL1, the conductive layers that underlie the first dummy word line DWL1 may be the word lines WLn to WLk+1, and the lowermost conductive layer may be the second dummy word line DWL2. The uppermost conductive layer surrounding the second vertical channel layer SP2 may be the second dummy gate line DGL2. The conductive layer that underlies the second dummy gate line DGL2 may be the source selection line SSL. The conductive layer that underlies the source selection line SSL may be the fourth dummy word line DWL4. The conductive layers that underlie the fourth dummy word line DWL4 may be the word lines WL0 to WLk. The lowermost conductive layer may be the third dummy word line DWL3.

In other words, a pair of conductive layer groups, for example, a first group of the conductive layers DGL1, DSL, DWL1, WLn to WLk+1 and DWL2 and a second group of the conductive layers DGL2, SSL, DWL4, WL0 to WLk and DWL3 may be stacked on the semiconductor substrate and each conductive layer of each conductive layer group is formed at different heights. Each pair of the conductive layers, for example, the first dummy gate line DGL1 and the second dummy gate line DGL2 may be formed at substantially the same height. The first vertical channel layer SP1, passing through the conductive layers DGL1, DSL, DWL1, WLn to WLk+1 and DWL2, may be vertically coupled between the bit line BL and the pipe channel layer PC. The second vertical channel layer SP2, passing through the conductive layers DGL2, SSL, DWL4, WL0 to WLk and DWL3, may be vertically coupled between the common source line CSL and the pipe channel layer PC.

A first dummy transistor DTR1 may be formed at a position where the first dummy gate line DGL1 surrounds the first vertical channel layer SP1. A drain select transistor DST may be formed at a position where the drain selection line DSL surrounds the first vertical channel layer SP1. A first dummy cell transistor DC1 may be formed at a position where the first dummy word line DWL1 surrounds the first vertical channel layer SP1. Main cell transistors Cn to Ck+1 may be formed at positions where the word lines WLn to WLk+1 surround the first vertical channel layer SP1. A second dummy cell transistor DC2 may be formed at a position where the second dummy word line DWL2 surrounds the first vertical channel layer SP1.

A second dummy transistor DTR2 may be formed at a position where the second dummy gate line DGL2 surrounds the second vertical channel layer SP2. A source select transistor SST may be formed at a position where the source selection line SSL surrounds the second vertical channel layer SP2. A fourth dummy cell transistor DC4 may be formed at a position where the fourth dummy word line DWL4 surrounds the second vertical channel layer SP2. Main cell transistors C0 to Ck may be formed at positions where the word lines WL0 to WLk surround the second vertical channel layer SP2. A third dummy cell transistor DC3 may be formed at a position where the third dummy word line DWL3 surrounds the second vertical channel layer SP2.

The above memory string may include the first dummy transistor DTR1, the drain select transistor DST, the first dummy cell transistor DC1, , the main cell transistors Cn to Ck+1 and the second dummy cell transistor DC2, which are vertically coupled to the semiconductor substrate between the bit line BL and the pipe channel layer PC; and the second dummy transistor DTR2, the source select transistor SST, the fourth dummy cell transistor DC4, the main cell transistors C0 to Ck and the third dummy cell transistor DC3, which are vertically coupled to the semiconductor substrate between the common source line CSL and the pipe channel layer PC.

As described above, in another type of 3D memory string, the dummy transistors DTR1 and DTR2, rather than the first and second select transistors DST and SST, may be coupled to the bit line BL or the common source line CSL.

Figure 4A:
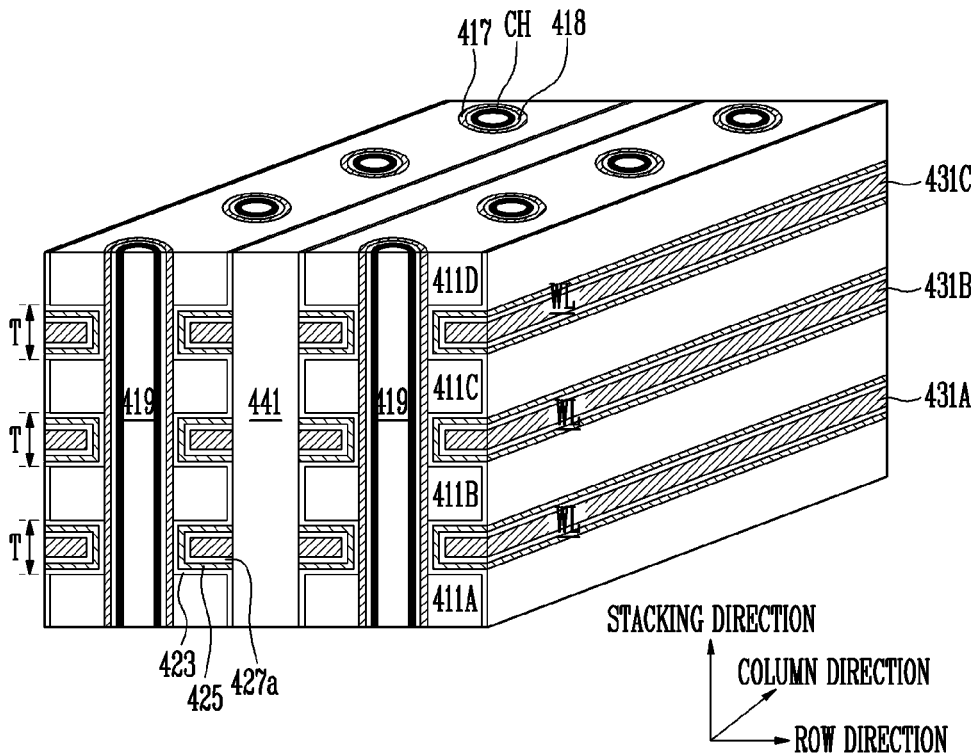
FIGS. 4A to 4C are perspective views of a memory device included in each of the memory strings of FIGS. 2A and 3B.
Figure 4B:
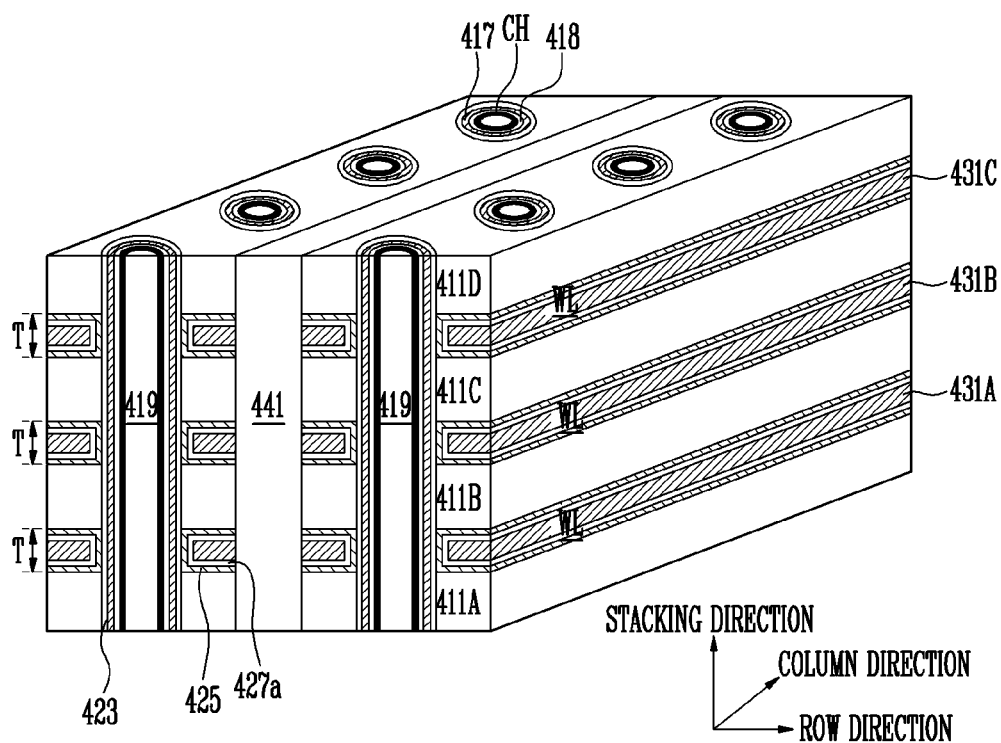
Figure 4C:
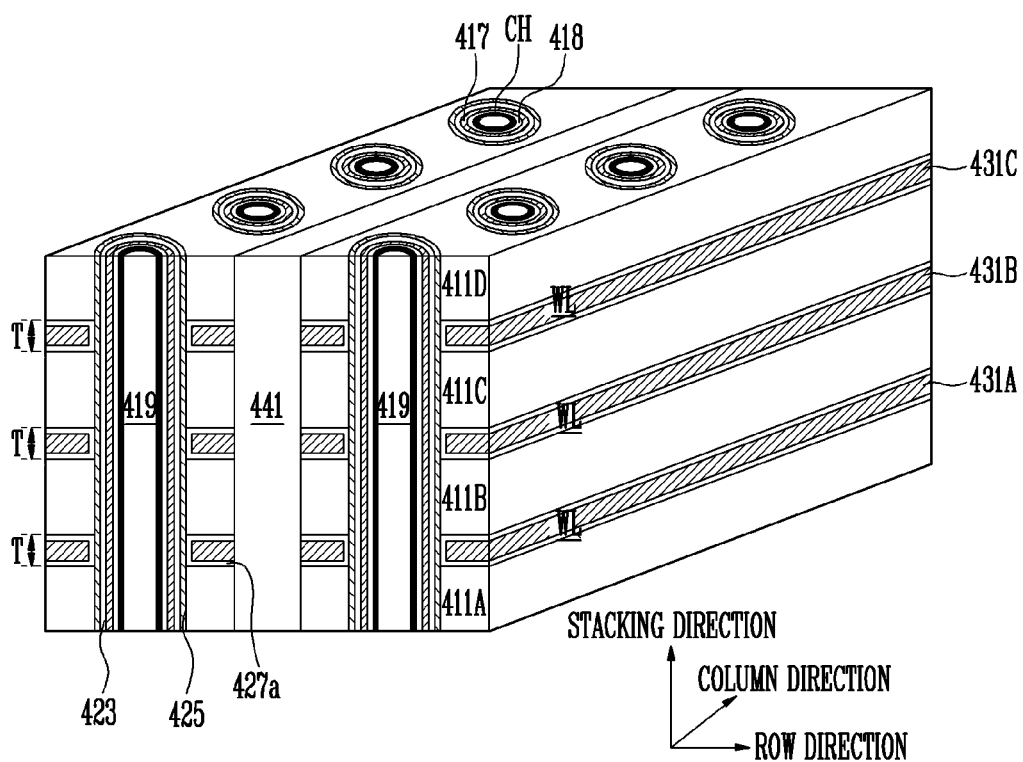

The structure of the memory cells, formed as in FIG. 2A or 3A, is described below. FIGS. 4A to 4C are perspective views of a memory device included in each of the memory strings of FIGS. 2A and 3A.

Referring to FIGS. 4A to 4C, a 3D non-volatile memory device according to an embodiment of the present invention may include vertical channel layers CH that protrude from the substrate and form a matrix including a plurality of rows and a plurality of columns. Each of the vertical channel layers CH may be formed in a tubular shape having a central portion filled with an insulating layer 419 or in a pillar shape having a surface and a central portion including a semiconductor material layer.

The vertical channel layer CH may be surrounded by a plurality of interlayer insulating layers 411A to 411D and a plurality of conductive layers 431A to 431C that are stacked alternately with each other. The interlayer insulating layers 411A to 411D and the conductive layers 431A to 431C may be divided by an insulating layer 441. The insulating layer 441 may be formed between the columns of the vertical channel layers CH adjacent to each other. The insulating layer 441 may pass through the plurality of interlayer insulating layers 411A to 411D and extend in a column direction.

The conductive layers 431A to 431C may be formed in trenches T between the interlayer insulating layers 411A to 411D adjacent to each other. The conductive layers 431A to 431C may be separated by the trenches T. Each of the trenches T may refer to a space defining where a word line WL is formed.

The conductive layers 431A to 431C may be surrounded by barrier metal patterns 427a. The barrier metal patterns 427a may be formed in the trenches T and separated by the trenches T.

A charge blocking layer 423 may be interposed between the vertical channel layer CH and the barrier metal patterns 427a, and diffusion barrier layers 425 may be interposed between the barrier metal patterns 427a and the charge blocking layer 423. In addition, a charge storage layer 417 may be interposed between the charge blocking layer 423 and the vertical channel layer CH. A tunnel insulating layer 418 may be interposed between the charge storage layer 417 and the vertical channel layer CH.

The tunnel insulating layer 418 may be formed on the vertical channel layer CH, and the charge storage layer 417 may be formed on the tunnel insulating layer 418. In an embodiment of the present invention, the charge storage layer 417 and the tunnel insulating layer 418 may surround an outer wall of the vertical channel layer CH.

As illustrated in FIG. 4A, the charge blocking layer 423 may be formed along surfaces of the trenches T and surround the barrier metal patterns 427a. Alternatively, as illustrated in FIGS. 4B and 4C, the charge blocking layer 423 may surround the outer wall of the vertical channel layer CH.

As illustrated in FIGS. 4A and 4B, the diffusion barrier layer 425 may be formed along the surfaces of the trenches T and surround the barrier metal patterns 427a. For example, the diffusion barrier layer 425 may be formed on the surfaces of the trenches T. Alternatively, for example, the diffusion barrier layers 425 may be formed on the charge blocking layer 423 formed on the surfaces of the trenches T. When the diffusion barrier layer 425 is an insulating layer, as illustrated in FIG. 4C, the diffusion barrier layer 425 may be formed over the outer wall of the vertical channel layer CH. For example, the diffusion barrier layer 425 may surround the outer wall of the vertical channel layer CH.

The conductive layers 431A to 431C in the trenches T and the barrier metal patterns 427a formed on the conductive layers 431A to 431C, e.g., surrounding the conductive layers 431A to 431C may function as the word lines WL. Memory cell transistors may be formed at intersections between the word lines WL and the vertical channel layer CH. According to the above-described structure, memory cell transistors according to various embodiments of the present invention may be stacked along the vertical channel layer CH and arranged in three dimensions.

Each of the conductive layers 431A to 431D may include a polysilicon layer or a material layer having a lower resistance and a higher work function than the polysilicon layer. For example, the conductive layers 431A to 431D may include tungsten (W). When each of the conductive layers 431A to 431D includes a material layer having a high work function, the back tunneling of charges through charge blocking layer 423 toward the charge storage layer may be reduced. When the back tunneling of charges is reduced, retention characteristics of the memory cells may be improved.

The barrier metal patterns 427a may include materials that prevent reactions between the conductive layers 431A to 431D having a high work function and the charge blocking layer 423. In addition, in order to reduce back tunneling, each of the barrier metal patterns 427a may include a material layer having a high work function. The barrier metal pattern 427a having a high work function may include a group III element, such as aluminum (Al), or a group V element. More specifically, the barrier metal layer 427 may include a doped polysilicon layer doped with TiAlN, TaN or p type impurities. When the Al content of the group III or V element in the barrier metal pattern 427a is increased, the work function of the barrier metal pattern 427a may be correspondingly increased. For example, the work function of the barrier metal pattern 427a may be increased by increasing the Al content of the barrier metal pattern 427a including TiAlN.

The diffusion barrier layer 425 may reduce or remove diffusion of impurities from the barrier metal pattern 427a into the charge blocking layer 423 due to heat and may include a group III or V element. In particular, when the group III element is included in the barrier metal patterns 427a in order to prevent diffusion of the impurities from the barrier metal patterns 427a, the diffusion barrier layer 425 may include the group V element. On the other hand, when the group V element is included in the barrier metal pattern 427a, the diffusion barrier layer 425 may include a group III element. According to the above-described embodiments of the present invention, since contrary types of impurities are included in the barrier metal patterns 427a and the diffusion barrier layers 425, respectively, first impurities (e.g., group III element) from the barrier metal pattern 427a may be included in the diffusion barrier layer 425 and offset by second impurities (e.g., group V element) of a type opposite the first impurities. As a result, the first impurities from the barrier metal pattern 427a may be prevented from being diffused into the charge blocking layer 423 or may be removed.

In particular, an impurity concentration of the vertical channel layers, included in the first and second dummy transistors DTR1 and DTR2, as illustrated in FIG. 2A or 3A may be different from an impurity concentration of the vertical channel layers included in the other transistors DC1 to DC4, DST, SST and C0 to Cn. In other words, the vertical channel layers of the first and second dummy transistors DTR1 and DTR2 of FIG. 2A or 3A may be doped with impurities (e.g., boron) in order to control threshold voltages. As a result, threshold voltages of the first and second dummy transistors DTR1 and DTR2 of FIG. 2A or 3A, which are coupled to the bit line or the common source line, may be determined by the impurities implanted into the vertical channel layers. Threshold voltages of the transistors DC1 to DC4, DST, SST in the memory string may have predetermined values. Also, threshold voltages of the transistors C0 to Cn in the memory string may be determined depending on data to be programmed.

In order to turn on the dummy transistors by a pass voltage applied to unselected word lines during a program operation (e.g., a program verify operation) or a read operation, the threshold voltages of the dummy transistors may be greater than 0V and less than the pass voltage.

Referring again to FIG. 1, the peripheral circuits may include a control circuit 120 and operation circuits 130 and 140.

The peripheral circuits 120 to 140 may be configured to perform a program loop, an erase loop and a read operation on memory cells included in a selected string. The peripheral circuits may include the control circuit 120 and the operation circuits 130 and 140. The control circuit 120 may be configured to control a program loop (e.g., a program operation), an erase loop (e.g., an erase operation) and a read operation. The operation circuits 130 and 140 may be configured to perform the program loop, the erase loop and the read operation in response to control signals of the control circuit 120. In order to perform the program loop, the erase loop and the read operation, the operation circuits 130 to 140 may selectively output operating voltages Verase, Vpgm, Vread, Vpass, Vinhibit, Vpv, Vgnd and Vpg to local lines (e.g., DGL1, DSL, DWL1, WLn to WLk+1, DWL2, DWL3, WLk to WL0, DWL4, SSL, DGL2 and PG of FIG. 3B) and the common source line CSL of a selected memory block. The operation circuits 130 to 140 may also control precharging and discharging operations of the bit lines BL and a current sensing at the bit lines BL.

As for a NAND flash memory, the operation circuits may include a voltage supply circuit 130 and a read/write circuit 140. Each of the operation circuits is described in detail below.

The control circuit 120 may output a voltage control signal V_CMD for controlling the voltage supply circuit 130 in response to a command signal CMD from an external device. The operating voltages Verase, Vpgm, Vread, Vpass, Vinhibit, Vpv, Vgnd and Vpg may be generated at desired levels in order to perform a program loop, an erase loop and a read operation in response to the voltage control signal V_CMD. In addition, the control circuit 120 may output control signals RW_CMD for controlling various circuits for read/write operations (e.g., page buffers), included in the read/write circuit 140, in order to perform a program loop, an erase loop and a read operation. In addition, the control circuit 120 may generate a column address signal and a row address signal when address signals ADD are input thereto. A memory block and a word line being selected according to a row address may be determined, and different operating voltages may be applied to a selected word line and unselected word lines.

The control circuit 120 may control the operation circuits 130 and 140 so that a program loop including a program operation and a program verify operation may be performed, for example, using an increment step pulse programming (ISPP) method. In addition, the control circuit 120 may control the operation circuits 130 and 140 so that an erase loop including an erase operation and an erase verify operation may be performed, for example, using an increment step pulse erasing (ISPE) method.

The voltage supply circuit 130 may generate the operating voltages Verase, Vpgm, Vread, Vpass, Vinhibit, Vpv, Vgnd and Vpg necessary for a program loop, an erase loop and a read operation of the memory cells in response to the voltage control signal V_CMD of the control circuit 120 and may selectively output the operating voltages Verase, Vpgm, Vread, Vpass, Vinhibit, Vpv, Vgnd and Vpg to the common source line CSL and the local lines (e.g., DGL1, DSL, DWL1, WLn to WLk+1, DWL2, DWL3, WLk to WL0, DWL4, SSL, DGL2 and PG of FIG. 3B) of the selected memory block in response to the row address signal of the control circuit 120.

The voltage supply circuit 130 may include a voltage generator (not illustrated) and a row decoder (not illustrated). The voltage generator may generate operating voltages Verase, Vpgm, Vread, Vpass, Vinhibit, Vpv, Vgnd and Vpg in response to the voltage control signal V_CMD of the control circuit 120. The row decoder may transfer the operating voltages onto local lines and a common source line of a selected memory block, among the memory blocks 110MB, in response to the row address signal of the control circuit 120.

The voltage supply circuit 130 may output or change the operating voltages Verase, Vpgm, Vread, Vpass, Vinhibit, Vpv, Vgnd and Vpg in response to the voltage control signal V_CMD of the control circuit 120.

In particular, the voltage supply circuit 130 may control voltages being applied to dummy transistors in response to control signals of the control circuit 120 so as to perform program operations on selected memory cells among the memory array 110 and program inhibit operations on unselected word cells among the memory array 110, which is described in detail below with reference to FIG. 5B.

The read/write circuit 140 may be coupled to the memory array 110 through the bit lines BL. During a program operation, the read/write circuit 140 may selectively precharge the bit lines BL in response to the control signals RW_CMD of the control circuit 120 and data DATA for storing in the memory cells. During a program verify operation or a read operation, the read/write circuit 140 may precharge the bit lines BL, sense voltage or current variations of the bit lines BL, and latch the data read from the memory cells, in response to the control signal RW_CMD of the control circuit 120.

Hereinafter, a method of operating a semiconductor memory device according to an embodiment of the present invention will be described below.

Figure 5A:
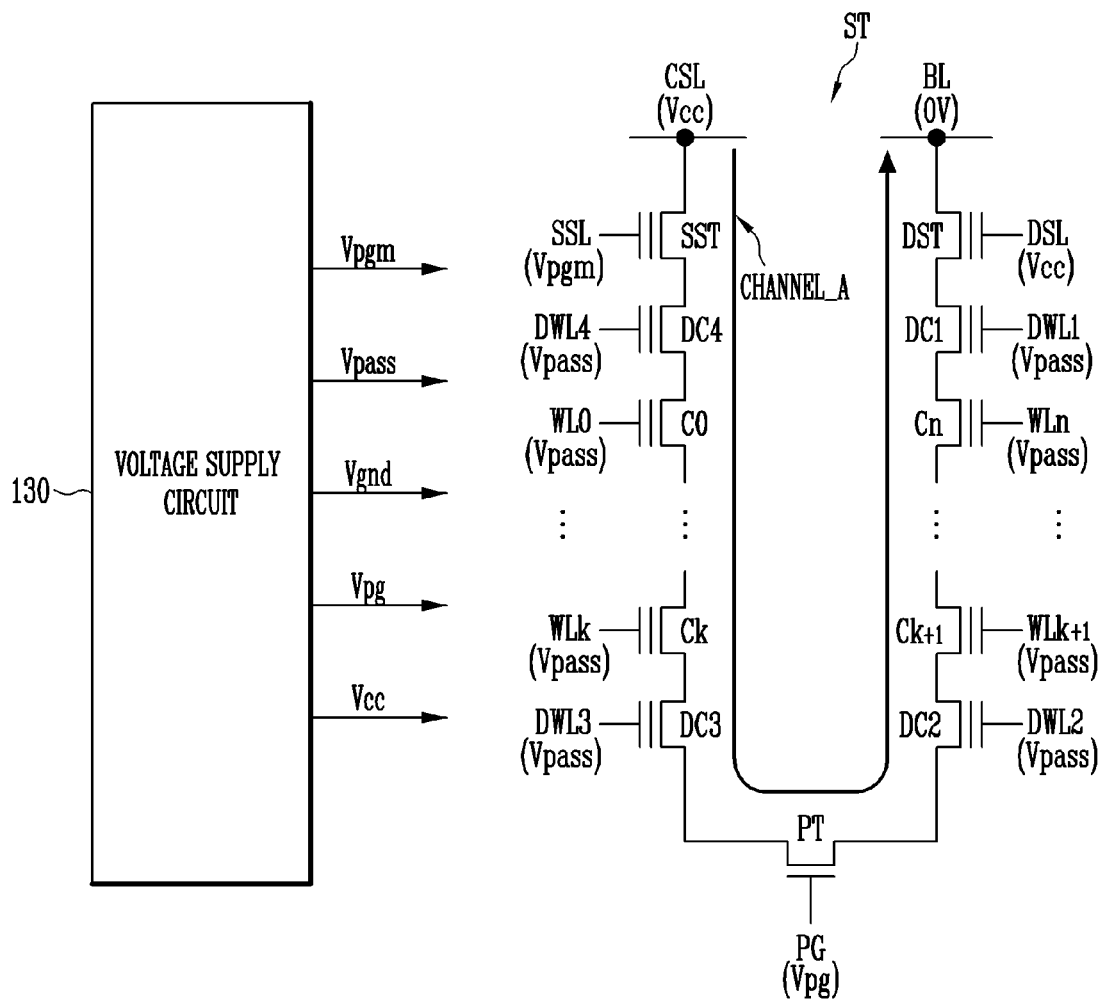
FIGS. 5A and 5B are circuit diagrams illustrating a method of operating a semiconductor memory device according to an embodiment of the present invention.

Referring to FIG. 5A, a threshold voltage of the second select transistor SST may have a predetermined value so that the second select transistor SST may function as a switching device. When the second select transistor SST includes a charge storage layer in the same manner as a cell transistor, a threshold voltage of the second select transistor SST may be controlled by a program operation. A program operation of the second select transistor SST may be performed by using the peripheral circuits 120 to 140 of FIG. 1 in order to increase the threshold voltage to a predetermined level, regardless of data, rather than to store data in the second select transistor SST.

During the program operation of the second select transistor SST, the read/write circuit 140 of FIG. 1 may apply a program enable voltage (0V) to the bit line BL. The voltage supply circuit 130 may apply a positive voltage (e.g., Vcc) to the common source line CSL in order to minimize a leakage current from a memory string ST to the common source line CSL.

In addition, the voltage supply circuit 130 may apply the program voltage Vpgm to the second selection line SSL in order to program the second select transistor SST, apply a positive voltage (e.g., Vcc) to the first selection line DSL and apply a program pass voltage Vpass to the other lines DWL1 to DWL4, WL0 to WLn and PG.

When the program operation of the second select transistor SST is performed under the above-described conditions, without any dummy transistor, the transistors SST, DC1 to DC4, PT, C0 to Cn and DST may be turned on, so that a current path CHANNEL_A may be formed between the common source line CSL to the bit line BL. As a result, the amount of current flowing from the common source line CSL to the bit line BL may be increased, and power consumption may be increased.

Figure 5B:
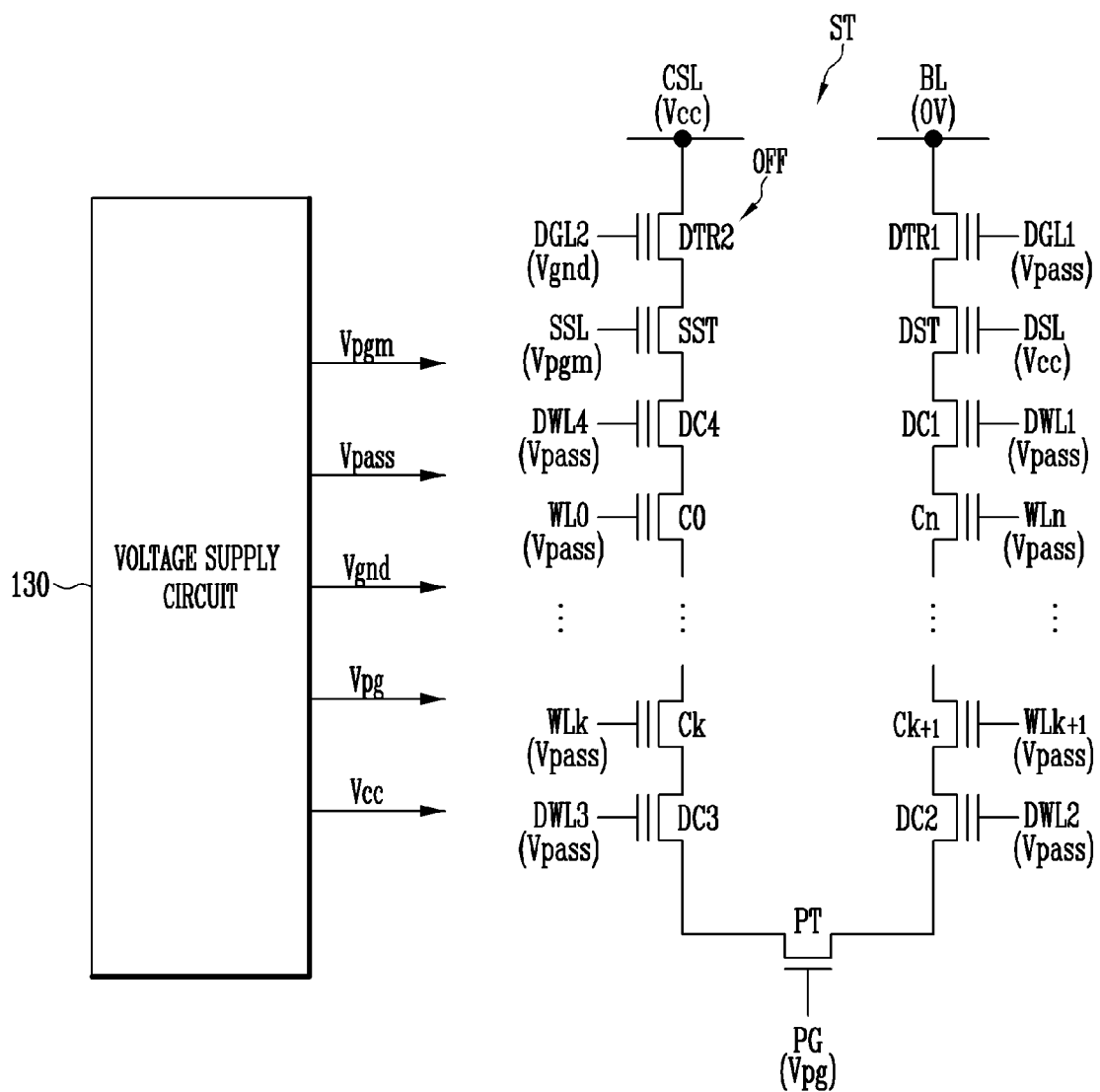

Referring to FIG. 5B, when the dummy transistor DTR2 is formed between the second select transistor SST and the common source line CSL, and the dummy transistor DTR2 is turned off during the program operation of the second select transistor, the current path CHANNEL_A may be prevented from being formed between the common source line CSL and the bit line BL. As a result, current consumption may be minimized.

When a program operation is performed to control the threshold voltage of the dummy transistor DTR2, a current path may be formed toward the bit line BL. As a result, current consumption may be increased. However, since the threshold voltage of the dummy transistor DTR2 is determined by the impurities implanted into the vertical channel layer, a separate program operation for the dummy transistor DTR2 may not be performed. As a result, the amount of current consumed to perform a program operation on the dummy transistor DTR2 may not be increased.

When another dummy transistor, e.g., the first dummy transistor DTR1 is formed between the bit line BL and the first select transistor DST, the program pass voltage Vpass may be applied to the first dummy transistor DTR1 in order to sufficiently turn on the first dummy transistor DTR1 during the program operation of the second select transistor SST. In other words, during the program operation of the second select transistor SST, the first dummy transistor DTR1 may be turned on, and the second dummy transistor DTR2 may be turned off. When the program operation of the first select transistor is performed, the first dummy transistor DTR1 may be turned on, and the second dummy transistor DTR2 may be turned off. In addition, when a program operation of a main cell is performed, the first dummy transistor DTR1 may be turned on, and the second dummy transistor DTR2 may be turned off.

Figure 6A:
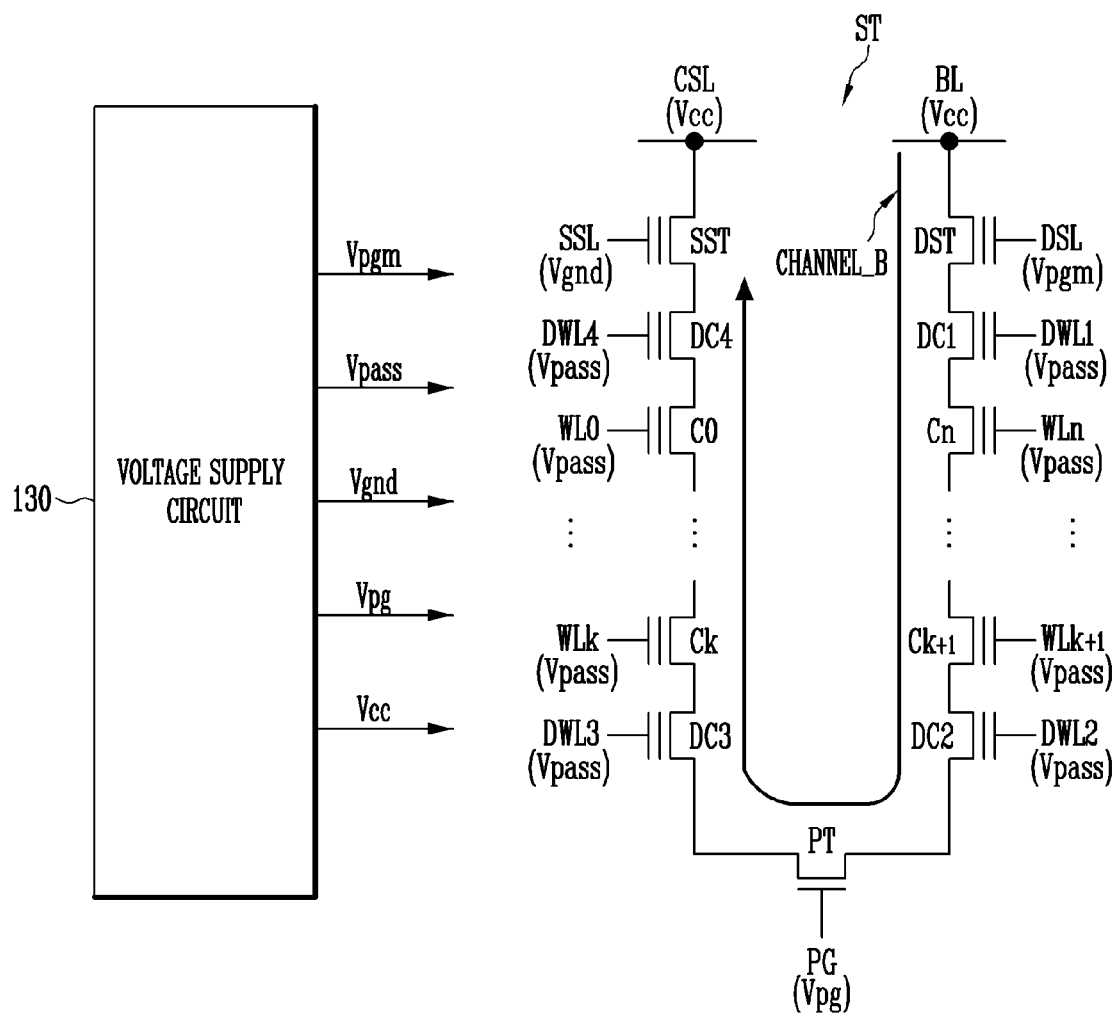
FIGS. 6A and 6B are circuit diagrams illustrating a method of operating a semiconductor memory device according to an embodiment of the present invention.
Figure 6B:
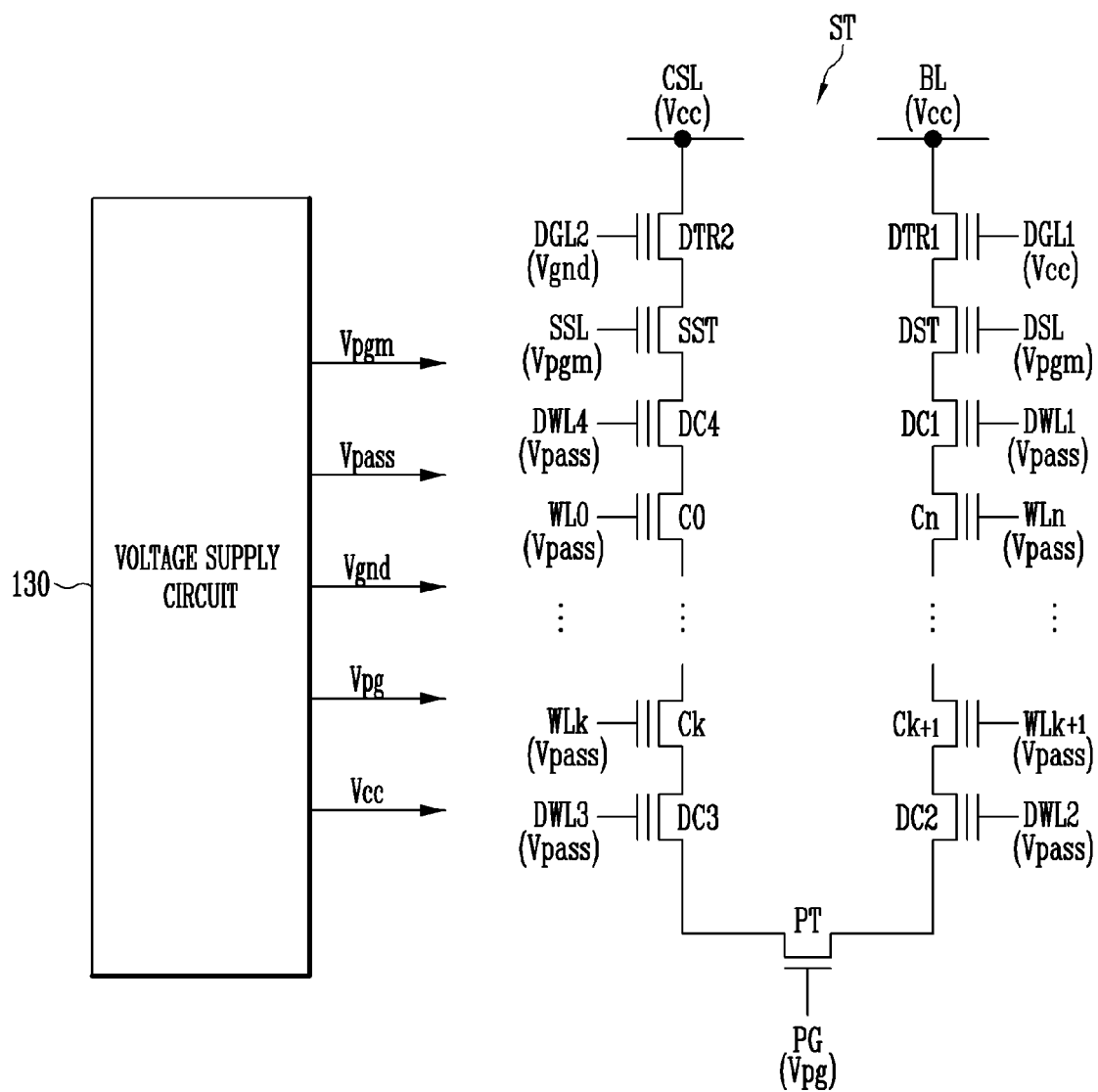

FIGS. 6A and 6B are circuit diagrams illustrating a method of operating a semiconductor memory device according to an embodiment of the present invention.

Referring to FIG. 6A, a program operation may be performed to increase a threshold voltage of each of the second select transistors DST to a target level. In order to narrow threshold voltage distributions of the second select transistors DST, the threshold voltage of the second select transistor having the threshold voltage less than the target level may continue to increase, and the threshold voltage of the second select transistor whose threshold voltage has reached the target level stops increasing.

In order to inhibit programming of the second select transistor DST having the threshold voltage greater than the target level during a program operation, the read/write circuit 140 of FIG. 1 may apply the program inhibit voltage Vcc to the bit line BL. In order to perform a program operation on the second select transistor having the threshold voltage less than the target level, the operating voltages Vpgm, Vpass, Vpg, Vgnd and Vcc, output from the voltage supply circuit 130, may be applied to the first selection line DSL, the dummy word lines DWL1 to DWL4, the pipe gate PG and the word lines WL0 to WLn.

In the memory string ST including the first select transistor DST whose threshold voltage has reached the target level, a boosting phenomenon may occur in a channel region due to the program inhibit voltage Vcc applied to the bit line BL. As a result, a voltage of the channel region may be increased, and the second select transistor DST may be program-inhibited by the channel voltage greater than the program inhibit voltage Vcc.

However, since the transistors DC1 to DC4, C0 to Cn and DST in the memory string ST, except for the second select transistor SST, are turned on by the operating voltages Vpgm, Vpass, Vpg, Vgnd and Vcc, a current path CHANNEL_B from the channel region of the memory string ST toward the bit line BL may remain unchanged. For this reason, the channel voltage of the memory string ST may not become greater than the program inhibit voltage Vcc. The second select transistor whose threshold voltage has reached the target level because of a high voltage difference between the drain selection lines DSL and the channel region may not be program-inhibited, and the threshold voltage of the second select transistor may continue to increase. As a result, the threshold voltage distribution of the second select transistors SST may be widened.

Referring to FIG. 6B, when the first dummy transistor DTR1 is formed between the first select transistor DST and the bit line BL, and the program inhibit voltage Vcc is applied to the bit line BL and the first dummy transistor DTR1, channel boosting may occur by the operating voltages Vpgm, Vpass, Vpg, Vgnd and Vcc that are applied to the lines DGL2, SSL, DWL1 to DWL4, WL0 to WLn, PG and DSL. The channel boosting may cause the first dummy transistor DTR1 to be turned off, so that the current path between the channel region of the memory string ST and the bit line BL may be blocked. In addition, the channel voltage of the memory string ST may become greater than the program inhibit voltage Vcc by the channel boosting, and the voltage difference between the channel region and the first selection line DSL may be reduced, so that the first select transistor DST whose threshold voltage has reached the target level may be program-inhibited.

As a result, the threshold voltage distribution of the first select transistors DST may become narrowed, and electrical characteristics may be improved.

A description has been made in reference to a case in which the program operation of the first select transistor DST and the program operation of the second select transistor SST are performed separately from each other. However, the program operations of the select transistors DST and SST may be performed at the same time by applying the program voltage Vpgm to the first and second selection lines DSL and SSL at the same time.

TABLE 1

|  | DTR1 | DTR2 |
| --- | --- | --- |
| Program operation of main cell transistor | Vpass | Vgnd or Vpass |
| Program verify operation of main cell transistor | Vpass | Vpass |
| Read operation of main cell transistor | Vpass | Vpass |
| Erase operation of main cell transistor | Floating | Floating |
| Program inhibit operation of first select transistor | Vcc | Vgnd or Vpass |
| Program operation of second select transistor | Vpass | Vgnd |

TABLE 1-continued

Referring to Table 1, the program pass voltage Vpass to be applied to unselected word lines may be applied to the first dummy transistor DTR1 during a program operation of a main cell transistor. A pass voltage Vpass or a ground voltage Vgnd may be applied to the second dummy transistor DTR2.

During a program verify operation or a read operation of the main cell transistor, a program verify pass voltage (Vpass) or a read pass voltage (Vpass) to be applied to the unselected word lines may be applied to the first and second dummy transistors DTR1 and DTR2. The program pass voltage may be the highest voltage, while the program verify pass voltage may be the lowest voltage.

During erase operations of the main cell transistors, the first and second dummy transistors DTR1 and DTR2 may be set to a floating state so as not to be affected by the erase operations.

During the program inhibit operation of the first select transistor DST, as described above, the program inhibit voltage (e.g., Vcc) to be applied to the bit line may also be applied to the first dummy transistor DTR1, and the program pass voltage Vpass or the ground voltage Vgnd may be applied to the second dummy transistor DTR2.

During the program operation of the second select transistor SST, as described above, the program pass voltage Vpass may be applied to the first dummy transistor DTR1, and the ground voltage Vgnd may be applied to the second dummy transistor DTR2.

During other operations, voltages that are applied to the unselected word lines may also be applied to the dummy transistors DTR1 and DTR2.

As described above, electrical characteristics may be improved by forming the dummy transistors DTR1 and DTR2 and applying voltages under the above-described conditions.

Figure 7:
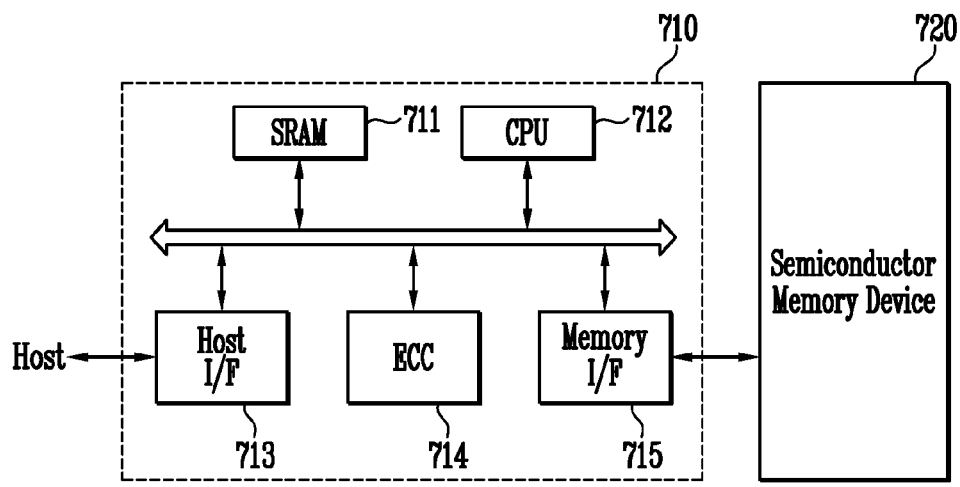
FIG. 7 is a schematic block diagram of a memory system according to an embodiment of the present invention.

FIG. 7 is a schematic view illustrating the configuration of a system having a semiconductor memory device according to an embodiment of the present invention.

Referring to FIG. 7, a system 700 according to an embodiment of the present invention may include a memory device 720 and a memory controller 710. The semiconductor memory device 720 may include a non-volatile memory device.

The semiconductor memory device 720 may include the above-described semiconductor memory device. The memory controller 710 may be configured to control the semiconductor memory device 720. The system 700 may be provided as a memory card or a solid state disk (SSD) in which the semiconductor memory device 720 and the memory controller 710 are combined. The system 700 may also be an electronic system having a memory device therein. For example, the system 700 may also be a mobile system having a memory device therein. Static random-access memory (SRAM) 711 may function as an operation memory of a processing unit 712. The host interface 713 may include a data exchange protocol of a host being coupled to the system 700. The host interface 713 may also be configured to communicate between the main controller and the memory controller. In addition, an error correction block 714 may detect and correct errors included in a data read from the semiconductor memory device 720. A memory interface 715 may interface with the semiconductor memory device 720. The memory interface 715 may be configured to communicate between the non-volatile memory device and the memory controller. The processing unit 712 may perform the general control operation for data exchange of the memory controller 710.

Though not illustrated in FIG. 7, it is obvious to a person of ordinary skill in the art that the system 700 may further include ROM (not illustrated) that stores code data to interface with the host. In addition, the memory device 720 may be a multi-chip package composed of a plurality of memory chips, for example, flash memory chips. The system 700 may be provided as a storage medium having high reliability and excellent operating characteristics. For example, a memory system such as a semiconductor disk device (solid state disk: hereinafter, SSD) on which active research has been performed may include a flash memory device according to an embodiment of the present invention. In this example, the memory controller 710 may be configured to communicate with an external device (e.g., a host) through one of the interface protocols including USB, MMC, PCI-E, SATA, PATA, SCSI, ESDI and IDE.

Figure 8:
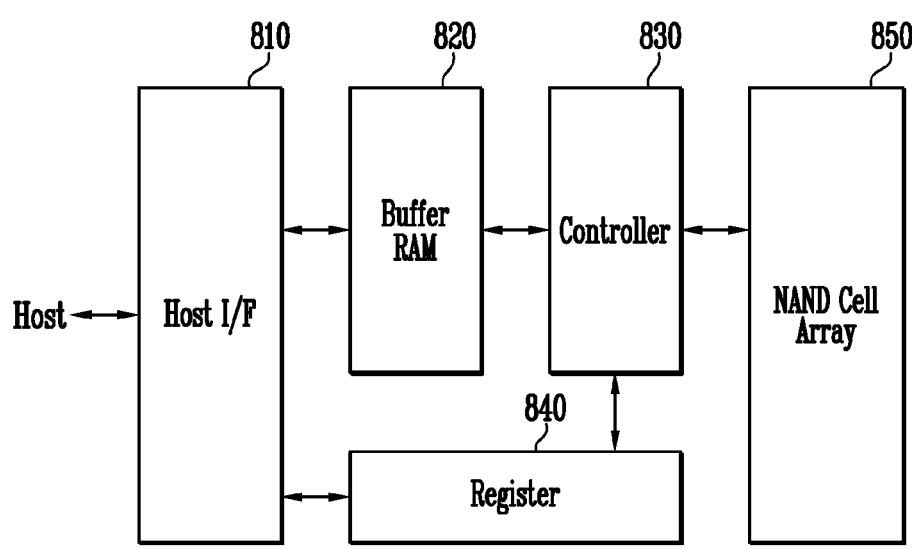
FIG. 8 is a schematic block diagram of a fusion memory device or a fusion memory system configured to a program operation.

FIG. 8 is a schematic block diagram of a fusion memory device or a fusion memory system configured to perform a program operation. For example, the technical features of the present invention may be used in a OneNAND flash memory device 800 as a fusion memory device.

The OneNand flash memory device 800 may include a host interface (I/F) 810, a buffer RAM 820, a controller 830, a register 840 and a NAND flash cell array 850. The host interface 810 may be configured to exchange various types of information with a device through different protocols. The buffer RAM 820 may have built-in codes for driving the memory device or temporarily store data. The controller 830 may be configured to control various operations such as read and program operations in response to a control signal and a command that are externally given. The register 840 may be configured to store data including instructions, addresses and configurations defining a system operating environment in the memory device. The NAND flash cell array 850 may have operation circuits including non-volatile memory cells and including page buffers. In response to a write request from a host, the OneNAND flash memory device 800 may program data by a general method.

Figure 9:
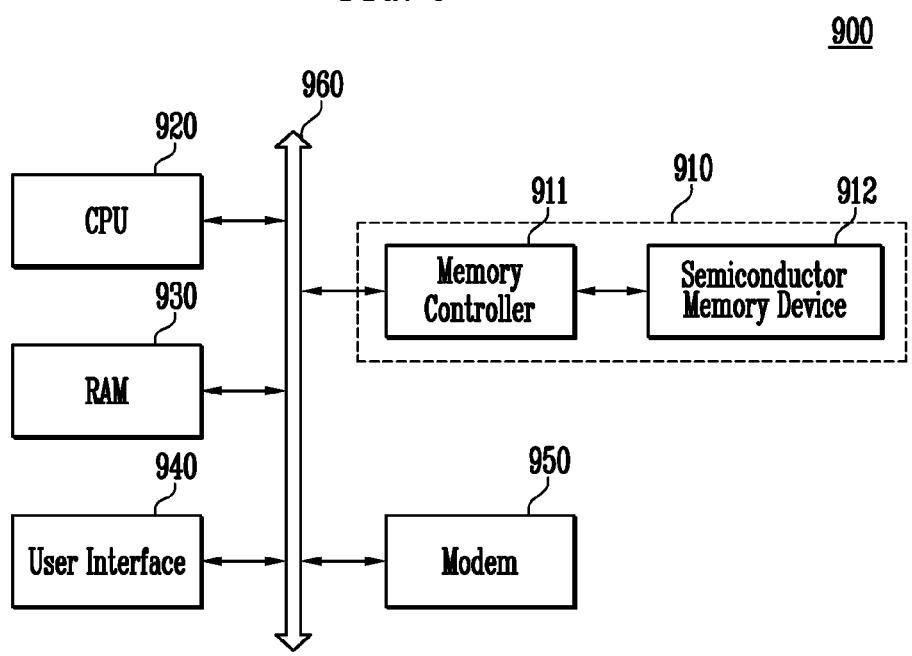
FIG. 9 is a schematic block diagram of a computing system including a flash memory device according to an embodiment of the present invention.

FIG. 9 is a schematic view of a computing system including a semiconductor memory device 912 according to an embodiment of the present invention.

As illustrated in FIG. 9, a computing system 900 according to an embodiment of the present invention may include a microprocessor 920, RAM 930, a user interface 940, a modem 950, such as a baseband chipset, and a memory system 910 that are coupled to a system bus 960. In addition, when the computing system 900 according to an embodiment of the present invention is a mobile device, a battery (not illustrated) may be additionally included to apply operating voltages to the computing system 900. Though not illustrated in FIG. 9, it is obvious to a person of ordinary skill in the art that the computing system 900 according to the present invention may further include application chipsets, a CMOS Image Sensor (CIS) and mobile DRAM. The memory system 910 may form a solid state drive/disk (SSD) using the non-volatile memory, described above with reference to FIG. 1, in order to store data. Alternatively, the memory system 910 may be provided as a fusion flash memory (e.g., OneNAND flash memory).

According to an embodiment of the present invention, electrical characteristics of a system having a semiconductor memory device may be improved.

What is claimed is:

1. A semiconductor memory device, comprising:
   a first select transistor;
   a first dummy transistor coupled between a bit line and the first select transistor;
   a second select transistor;
   a second dummy transistor coupled between a common source line and the second select transistor; and
   main cell transistors coupled between the first and second select transistors,
   wherein each of the first and second dummy transistors, the first and second select transistors and the main cell transistors includes a portion of a vertical channel layer, a tunnel insulating layer surrounding the vertical channel insulating layer surrounding the charge storage layer and a conductive layer surrounding the blocking insulating layer, the vertical channel layer being extended in a direction intersecting a substrate, and
   wherein an impurity concentration of a first portion of the vertical channel layer, included in each of the first and second dummy transistors, is different from an impurity concentration of a second portion of the vertical channel layer, included in each of the first and second select transistors and each of the main cell transistors.

2. The semiconductor memory device of claim 1, further comprising:
   a first dummy cell transistor coupled between the first select transistor and the main cell transistors; and
   a second dummy cell transistor coupled between the second select transistor and the main cell transistors.

3. The semiconductor memory device of claim 1, wherein the main cell transistors are coupled between the first and second select transistors and are vertically coupled to a substrate.

4. The semiconductor memory device of claim 1, wherein the main cell transistors are divided into a first main cell transistor group and a second main cell transistor group, and
   the semiconductor memory device further includes a pipe transistor coupled between the first and second main cell transistor groups.

5. The semiconductor memory device of claim 4, wherein the main cell transistors of the first main cell transistor group, coupled between the first select transistor and the pipe transistor, are vertically coupled to a substrate, and
   the main cell transistors of the second main cell transistor group, coupled between the second select transistor and the pipe transistor, are vertically coupled to the substrate.

6. The semiconductor memory device of claim 4, further comprising:
   a third dummy cell transistor coupled between the pipe transistor and the first main cell transistor group; and
   a fourth dummy cell transistor coupled between the pipe transistor and the second main cell transistor group.

7. The semiconductor memory device of claim 1, wherein the first portion of the vertical channel layer of each of the first and second dummy transistors includes a silicon layer doped with impurities to control a threshold voltage.

8. include allowable subject matter since the prior art made of record and considered pertinent to the applicant's disclosure, taken individually or in combination, does not teach or suggest the claimed invention having:
   a plurality of memory strings coupled between a plurality of bit lines and a common source line, wherein each of the plurality of memory strings includes a first dummy transistor coupled to the bit line, main cell transistors, a first select transistor coupled between the first dummy transistor and the main cell transistors, and a second dummy transistor coupled to the common source line, and a second select transistor coupled between the second dummy transistor and the main cell transistors; and a peripheral circuit configured to perform a program operation of the first and second select transistors and the main cell transistors and a read operation and an erase operation of the main cell transistors, wherein each of the first and second dummy transistors, the first and second select transistors and the main cell transistors includes a portion of a vertical channel layer, a tunnel Insulating layer surrounding the vertical channel layer, a charge storage layer surrounding the tunnel insulating layer, a blocking Insulating layer surrounding the charge storage layer and a conductive layer surrounding the blocking insulating layer~ the vertical channel layer being extended in a direction intersecting a substrate, wherein an impurity concentration of a first portion of the vertical channel layer, included in each of the first and second dummy transistors, is different from an impurity concentration of a second portion of the vertical channel layer, included in each of the first and second select transistors and each of the main cell transistors, and wherein the peripheral circuit is configured to turn on the first dummy transistor and turn off the second dummy transistor during the program operation.

9. The semiconductor memory device of claim 8, wherein threshold voltages of the first and second dummy transistors are determined by impurities implanted into the first portion of the vertical channel layer, included in each of the first and second dummy transistors, and threshold voltages of the first and second select transistors and the main cell transistors are determined by the program operations performed by the peripheral circuit.

10. The semiconductor memory device of claim 8, wherein the peripheral circuit performs the program operation of the first and second select transistors in order to increase threshold voltages of the first and second select transistors to a predetermined level, irrespective of data.

11. The semiconductor memory device of claim 8, wherein the peripheral circuit is configured to apply a program inhibit voltage to the bit line and the first dummy transistor in order to inhibit programming of the first select transistor having a threshold voltage greater than a target level during the program operation of the first select transistors.

12. The semiconductor memory device of claim 8, wherein the peripheral circuit performs the program operation of the first and second select transistors at the same time.

13. The semiconductor memory device of claim 8, wherein the peripheral circuit is configured to apply a read pass voltage to the first and second dummy transistors during the read operations of the main cell transistors.

14. The semiconductor memory device of claim 8, wherein the peripheral circuit is configured to set gates of the first and second dummy transistors to a floating state during the erase operation of the main cell transistors.

15. The semiconductor memory device of claim 8, further comprising:
   a first dummy cell transistor coupled between the first select transistor and the main cell transistors; and
   a second dummy cell transistor coupled between the second select transistor and the main cell transistors.

16. include allowable subject matter since the prior art made of record and considered pertinent to the applicant's disclosure, taken individually or in combination, does not teach or suggest the claimed invention having:
   a first dummy transistor formed where a first dummy gate line surrounds a vertical channel layer and coupled to a first select transistor, the vertical channel layer being extended in a direction intersecting a substrate and;
   a second dummy transistor formed where a second dummy gate line surrounds the vertical channel layer and coupled to a second select transistor; and
   main cell transistors coupled between the first and second select transistors,
   wherein an impurity concentration of a first portion of the vertical channel layer, corresponding to each of the first and second dummy transistors, is different from an impurity concentration of a second portion of the vertical channel layer, corresponding to each of the first and second select transistors.

17. The semiconductor memory device of claim 16, wherein the first dummy transistor is coupled between the first select transistor and a bit line, and
the second dummy transistor is coupled between the second select transistor and a common source line.

* * * * *